United States Patent
Kawasaki et al.

(10) Patent No.: US 11,451,208 B2
(45) Date of Patent: Sep. 20, 2022

(54) SWITCHING CIRCUIT AND VARIABLE ATTENUATOR

(71) Applicant: Mitsubishi Electric Corporation, Tokyo (JP)

(72) Inventors: Kengo Kawasaki, Tokyo (JP); Masaomi Tsuru, Tokyo (JP); Mitsuhiro Shimozawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 57 days.

(21) Appl. No.: 17/015,978

(22) Filed: Sep. 9, 2020

(65) Prior Publication Data

US 2020/0412321 A1 Dec. 31, 2020

Related U.S. Application Data

(63) Continuation of application No. PCT/JP2018/013299, filed on Mar. 29, 2018.

(51) Int. Cl.
| | | |
|---|---|---|
| *H03H 7/25* | (2006.01) | |
| *H01P 1/22* | (2006.01) | |
| *H03H 11/16* | (2006.01) | |
| *H03H 11/24* | (2006.01) | |
| *H03K 17/04* | (2006.01) | |
| *H03K 17/687* | (2006.01) | |

(52) U.S. Cl.
CPC ............... *H03H 7/25* (2013.01); *H01P 1/22* (2013.01); *H03H 11/16* (2013.01); *H03H 11/245* (2013.01); *H03K 17/04* (2013.01); *H03K 17/687* (2013.01)

(58) Field of Classification Search
CPC ............ H03H 7/25; H03H 7/24; H03H 7/253; H03H 7/255; H03H 7/256; H03H 11/24; H03H 11/245; H03H 11/16; H03H 11/20; H01P 1/22; H03K 17/04; H03K 17/687
See application file for complete search history.

(56) References Cited

U.S. PATENT DOCUMENTS

| | | | |
|---|---|---|---|
| 5,666,089 A | 9/1997 | Ehlers | |
| 2011/0140755 A1* | 6/2011 | Hong | H03H 7/25 |
| | | | 327/308 |

FOREIGN PATENT DOCUMENTS

| | | |
|---|---|---|
| EP | 2 337 219 A1 | 6/2011 |
| JP | 2-88303 U | 7/1990 |
| JP | 11-55059 A | 2/1999 |
| JP | 2003-309454 A | 10/2003 |
| JP | 2009-152861 A | 7/2009 |

OTHER PUBLICATIONS

Extended European Search Report for European Application No. 18912940.6, dated Feb. 5, 2021.
European Communication pursuant to Article 94(3) EPC for European Application No. 18912940.6, dated Nov. 10, 2021.
International Search Report issued in PCT/JP2018/013299, dated Jun. 19, 2018.

* cited by examiner

*Primary Examiner* — Stephen E. Jones
(74) *Attorney, Agent, or Firm* — Birch, Stewart, Kolasch & Birch, LLP

(57) ABSTRACT

A first switch is connected in parallel with a circuit element. A second switch is connected in series with a parallel circuit constituted by the circuit element and the first switch. The first switch and the second switch alternately perform on-off operation.

15 Claims, 4 Drawing Sheets

US 11,451,208 B2

SWITCHING CIRCUIT AND VARIABLE ATTENUATOR

CROSS REFERENCE TO RELATED APPLICATION

This application is a Continuation of PCT International Application No. PCT/JP2018/013299, filed on Mar. 29, 2018, which is hereby expressly incorporated by reference into the present application.

TECHNICAL FIELD

The present invention relates to a switching circuit in which a circuit element is connected in parallel or in series with a first switch and a second switch, which are controlled to be alternately on and off by the switching circuit, and to a variable attenuator including the switching circuit.

BACKGROUND ART

For compensation for phase change caused by a parasitic element at switching, a switching circuit of related art loads an inductive element to resonate with a capacitive parasitic element, so that the influence of the parasitic element is cancelled, for example (refer to Patent Literature 1, for example).

CITATION LIST

Patent Literatures

Patent Literature 1: JP 2003-309454 A

SUMMARY OF INVENTION

Technical Problem

Because resonance of the inductive element and the parasitic capacitance is used, however, the switching circuit of the related art has a problem of a narrow band.

The present invention has been made to solve such problems as described above, and an object thereof is to provide a switching circuit capable of reducing phase change at switching over a wide band.

Solution to Problem

A switching circuit according to the invention includes a first switch connected in parallel with a circuit element, and a second switch connected in series with a parallel circuit constituted by the circuit element and the first switch, wherein the first switch and the second switch alternately perform on-off operation, and the second switch has a parasitic capacitance set in such a way that a parasitic capacitance occurring at the parallel circuit in a first state in which the first switch is controlled to be off and the second switch is controlled to be on and a parasitic capacitance occurring at the second switch in a second state in which the first switch is controlled to be on and the second switch is controlled to be off are equal to each other.

Advantageous Effects of Invention

In the variable attenuator according to the invention, switches are connected in series and in parallel with a circuit element, and alternately perform on-off operation. This enables reduction of phase change at switching over a wide band.

DESCRIPTION OF EMBODIMENTS

Embodiments for carrying out the invention will now be described with reference to the accompanying drawings for more detailed explanation of the invention.

First Embodiment

Figure 1:
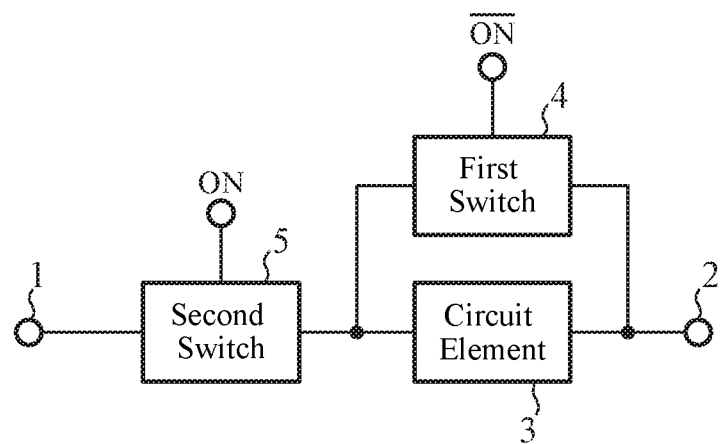
FIG. 1 is a configuration diagram illustrating a switching circuit according to a first embodiment of the invention.

FIG. 1 is a configuration diagram illustrating a switching circuit according to the present embodiment.

The switching circuit illustrated in FIG. 1 includes a first terminal 1, a second terminal 2, a circuit element 3, a first switch 4, and a second switch 5. A signal source with an internal impedance $Z_0$ is connected with the first terminal 1, and a load with an impedance $Z_0$ is connected with the second terminal 2. Note that the signal source and the load are not illustrated. The first switch 4 is connected in parallel with the circuit element 3, and the second switch 5 is connected in series with the circuit element 3. A parallel circuit of the circuit element 3 and the first switch 4 is connected with the second terminal 2, and the second switch 5 is connected with the first terminal 1. The first switch 4 and the second switch 5 are switches controlled to be alternately on and off, and constituted by FETs such as MOS FETs or HEMTs, or MEMS switches. An on state of each of the switches will be expressed by an on-resistance and an off state thereof will be expressed by an off-capacitance.

Next, operation of the switching circuit having such a configuration will be explained.

Figure 2A:
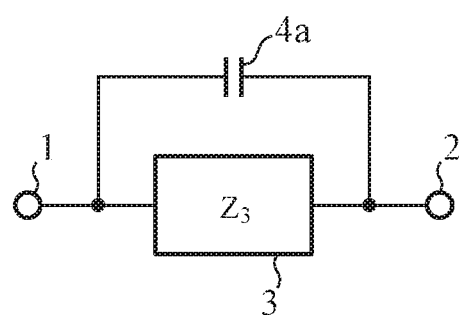
FIG. 2A is an equivalent circuit diagram illustrating operation in a first state of the switching circuit.
Figure 2B:
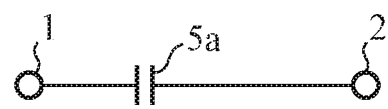
FIG. 2B is an equivalent circuit diagram illustrating operation in a second state of the switching circuit according to the first embodiment of the invention.

When a signal is input through the first terminal 1, control is performed so that the second switch 5 is on and the first switch 4 is off in a first state. In contrast, in a second state, control is performed so that the second switch 5 is off and the first switch 4 is on. The on-resistances of the first switch 4 and the second switch 5 are $R_{on4}, R_{on5} \approx 0$ (equally zero), which are deemed to be negligible, and the off-capacitances 4a and 5a are represented by $C_4$ and $C_5$, respectively. An equivalent circuit of the first state in FIG. 1 is illustrated in FIG. 2A, and an equivalent circuit of the second state is illustrated in FIG. 2B.

Calculation of the phase of a pass characteristic S21 in the first state of FIG. 2A when the impedance $Z_3$ of the circuit element 3 is a resistance $R_3$ is as follows.

$$\tan \theta_1 = \frac{\omega C_4 R_3^2}{2Z_0 + R_3 + 2\omega^2 C_4^2 R_3^2 Z_0} \quad (1)$$

Calculation of the phase of the pass characteristic S21 in the second state of FIG. 2B in a similar manner is as follows.

$$\tan \theta_2 = \frac{1}{2\omega C_5 Z_0} \quad (2)$$

A condition for reducing phase fluctuation in the first state and the second state is $\tan \theta_1 = \tan \theta_2$, and a condition to meet the condition is implemented by the formulas (1) and (2) as follows.

$$C_5 = C_4 + \frac{1}{\omega^2 C_4 R_3} \left( \frac{1}{R_3} + \frac{1}{2Z_0} \right) \quad (3)$$

At high frequencies or when $R_3$ is a large value, $C_4 = C_5$ is obtained, and meeting this condition enables reduction of phase fluctuation over a wide band regardless of the frequency.

In a similar manner, when $Z_3$ is a capacitance $C_3$, a condition for reducing phase fluctuation is obtained as follows.

$$C_5 = C_3 + C_4 \quad (4)$$

Meeting the formula (4) enables reduction of phase fluctuation over a wide band regardless of the frequency.

In a similar manner, when $Z_3$ is an inductive element $L_3$, a condition for reducing phase fluctuation is obtained as follows.

$$C_5 = C_4 - \frac{1}{\omega^2 L_3} \quad (5)$$

At high frequencies or when $L_3$ is a large value, meeting $C_4 = C_5$ enables reduction of phase fluctuation over a wide band regardless of the frequency.

Note that FETs or the like are used for the first switch 4 and the second switch 5 in the present embodiment, and one end of each switch may be a drain while the other end thereof may be a source, or conversely, one end may be a source and the other may be a drain.

As described above, according to the switching circuit of the first embodiment, the first switch connected in parallel with the circuit element, and the second switch connected in series with the parallel circuit constituted by the circuit element and the first switch are included, and the first switch and the second switch alternately perform on-off operation, which enables reduction of a phase change at switching over a wide band.

In addition, according to the switching circuit of the first embodiment, because the first switch and the second switch each operate as a short circuit in the on state and obtain capacitance in the off state, the switching circuit is implemented with a simple configuration.

Second Embodiment

In a second embodiment, the first switch and the second switch are switches each expressed by a resistor in the on state and an inductive parasitic element in the off state.

Figure 3:
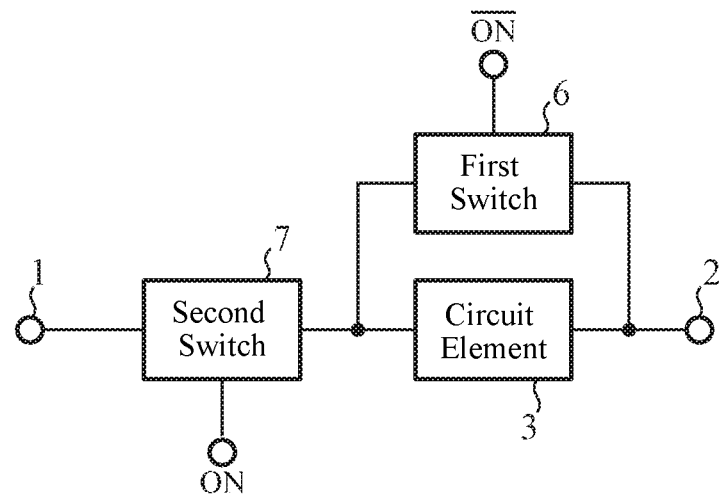
FIG. 3 is a configuration diagram illustrating a switching circuit according to a second embodiment of the invention.

FIG. 3 is a configuration diagram illustrating a switching circuit according to the second embodiment. The switching circuit illustrated in FIG. 3 includes a first terminal 1, a second terminal 2, a circuit element 3, a first switch 6, and a second switch 7. Each of the first switch 6 and the second switch 7 is a resistor in the on state and an inductive parasitic element in the off state, and the other components are similar to those in the first embodiment. The first switch 6 and the second switch 7 are constituted by MOS FETs, HEMTs, MEMS switches, or the like.

Next, operation of the switching circuit of the second embodiment will be explained.

Figure 4A:
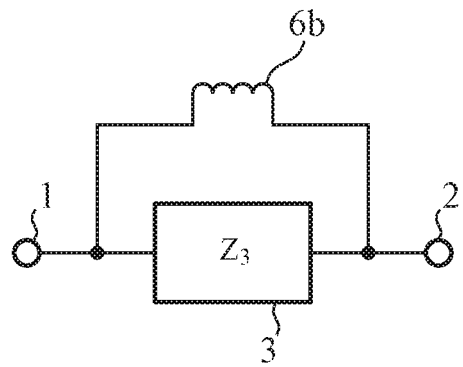
FIG. 4A is an equivalent circuit diagram illustrating operation in a first state of the switching circuit.
Figure 4B:
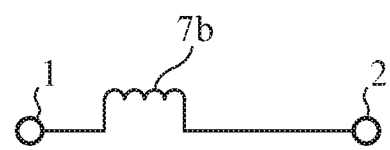
FIG. 4B is an equivalent circuit diagram illustrating operation in a second state of the switching circuit according to the second embodiment of the invention.

In the first state, control is performed so that the second switch 7 is on and the first switch 6 is off. In contrast, in the second state, control is performed so that the second switch 7 is off and the first switch 6 is on. The on-resistances of the first switch 6 and the second switch 7 are $R_{on6}, R_{on7} \approx 0$ (equally zero), which are deemed to be negligible, and the inductive parasitic elements 6b and 7b in the off state are represented by $L_6$ and $L_7$, respectively. An equivalent circuit of the first state in FIG. 3 is illustrated in FIG. 4A, and an equivalent circuit of the second state is illustrated in FIG. 4B.

Calculation of the phase of the pass characteristic S21 in the first state illustrated in FIG. 4A when the impedance $Z_3$ of the circuit element 3 is a resistance $R_3$ is as follows.

$$\tan \theta_1 = \frac{-\omega L_6 R_3^2}{2Z_0 R_3^2 + \omega^2 + L_6^2 + (2Z_0 + R_3)} \quad (6)$$

Calculation of the phase of the pass characteristic S21 in the second state illustrated in FIG. 4B in a similar manner is as follows.

$$\tan \theta_1 = \frac{-\omega L_7}{2Z_0} \quad (7)$$

The following is sufficient for reducing phase fluctuation.

$$\frac{1}{\tan \theta_1} = \frac{1}{\tan \theta_2} \qquad (8)$$

A condition to meet this is obtained as follows by the formulas (6) and (7).

$$\frac{1}{L_7} = \frac{1}{L_6} + \frac{\omega^2 L_6}{R_3}\left(\frac{1}{R_3} + \frac{1}{2Z_0}\right) \qquad (9)$$

At low frequencies or when $R_3$ is sufficiently large, meeting $L_6=L_7$ enables reduction of phase fluctuation regardless of the frequency.

In a similar manner, a condition for reducing phase fluctuation when $Z_3$ is a capacitance ($C_3$) is as follows:

$$\frac{1}{L_7} = \frac{1}{L_6} + \omega^2 C_3 \qquad (10)$$

At low frequencies or when $C_3$ is sufficiently small, $L_6=L_7$ is obtained, which enables reduction of phase fluctuation regardless of the frequency.

In a similar manner, a condition for reducing phase fluctuation when $Z_3$ is an inductive element ($L_3$) is as follows:

$$\frac{1}{L_7} = \frac{1}{L_3} + \frac{1}{L_6} \qquad (11)$$

This enables reduction of phase fluctuation regardless of the frequency.

FETs or the like are used for the switches in the present embodiment, and one end of each switch may be a drain while the other end thereof may be a source, or conversely, one end may be a source and the other may be a drain.

As described above, according to the switching circuit of the second embodiment, because the first switch and the second switch each operate as a short circuit in the on state and an inductor in the off state, the switching circuit is implemented with a simple configuration.

Third Embodiment

In a third embodiment, the switching circuit of the first or second embodiment is used for two shunt circuits of a π-attenuator.

Figure 5:
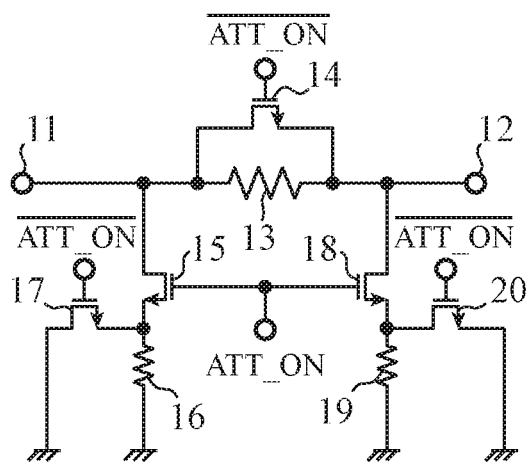
FIG. 5 is a configuration diagram illustrating a variable attenuator according to a third embodiment of the invention.

FIG. 5 is a configuration diagram illustrating a variable attenuator according to the third embodiment. The variable attenuator illustrated in FIG. 5 includes a first terminal 11, a second terminal 12, a resistor 13, a third switch 14, second switches 15 and 18, resistors 16 and 19, and first switches 17 and 20. The first terminal 11 is an input terminal of the variable attenuator, and the second terminal 12 is an output terminal thereof. The resistor 13 is a series resistor of the π-attenuator, and is connected between the first terminal 11 and the second terminal 12. The third switch 14 is a switch connected in parallel with the resistor 13. The second switch 15 is a switch connected in series with a shunt through the first terminal 11, and corresponds to the second switch 5 of the first embodiment. The resistor 16 is connected in series with the second switch 15, and is a resistor corresponding to the circuit element 3 of the first embodiment. The first switch 17 is a switch connected with a shunt through a connecting point between the second switch 15 and the resistor 16 in parallel with the resistor 16, and corresponds to the first switch 4 of the first embodiment. The second switch 18 is a switch connected in series with a shunt through the second terminal 12, and corresponds to the second switch 5 of the first embodiment. The resistor 19 is a resistor connected in series with the second switch 18, and corresponding to the circuit element 3 of the first embodiment. The first switch 20 is a switch connected with a shunt through a connecting point between the second switch 18 and the resistor 19 in parallel with the resistor 19, and corresponds to the first switch 4 of the first embodiment. As described above, in the variable attenuator of the third embodiment, the switching circuit including the second switch 15, the resistor 16, and the first switch 17 and the switching circuit including the second switch 18, the resistor 19, and the first switch 20 are used for two shunt circuits of the π-attenuator.

FETs are used for the third switch 14, the second switches 15 and 18, and the first switches 17 and 20, which are expressed by resistors in the on state and capacitive parasitic elements in the off state. The on-resistances in the on state are deemed to be negligible, the parasitic capacitances in the off state are represented by 14a, 15a, 18a, 17a, and 20a, and the capacitance values thereof are $C_{14}$, $C_{15}$, $C_{18}$, $C_{17}$, and $C_{20}$. In addition, the resistance values of the resistors 13, 16, and 19 are $R_{13}$, $R_{16}$, and $R_{19}$. Note that a switch using an FET uses connection between a drain terminal and a source terminal as a switch, and the drain terminal and the source terminal of the connection illustrated in FIG. 5 may be reversed.

Next, operation of the variable attenuator of the third embodiment having such a configuration will be explained.

The π-attenuator of the third embodiment is capable of switching to a first state in which an input signal is attenuated by the resistor 13, the resistor 16, and the resistor 19, and a second state in which the resistor 13 is short-circuited and the resistor 16 and the resistor 19 are disconnected from the first terminal 11 and the second terminal 12, respectively, so that an input signal is not attenuated.

In the first state, the second switches 15 and 18 are in the on state, and the third switch 14 and the first switches 17 and 20 are in the off state. In the second state, the second switches 15 and 18 are in the off state, and the third switch 14 and the first switches 17 and 20 are in the on state. In addition, in the π-attenuator, because the resistor 13 typically has a low resistance, its relation with the off-capacitance of the switch is $R_{13} \ll 1/j\omega C_{14}$.

Figure 6A:
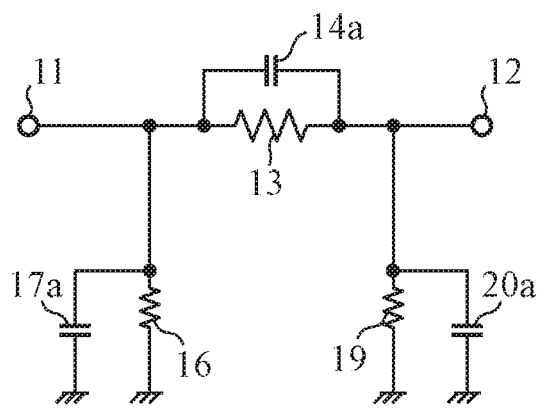
FIG. 6A is an equivalent circuit diagram illustrating operation in a first state of the variable attenuator.
Figure 6B:
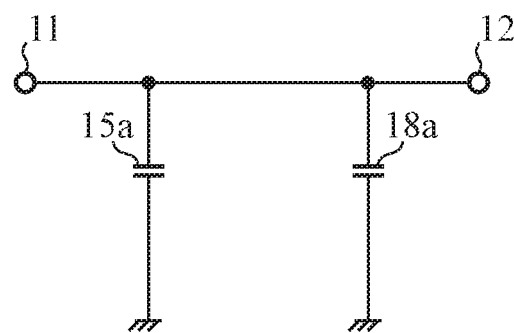
FIG. 6B is an equivalent circuit diagram illustrating operation in a second state of the variable attenuator according to the third embodiment of the invention.

An equivalent circuit of the first state is illustrated in FIG. 6A, and an equivalent circuit of the second state is illustrated in FIG. 6B. At higher frequencies or when the values of $R_{16}$ and $R_{19}$ are larger than those in the formula (3) of the first embodiment, the phase fluctuation in the first state and the second state can be reduced independently of the frequency. In addition, the capacitance does not affect the absolute value of the attenuation of the π-attenuator. Thus, characteristics with different pass amplitudes, with the fluctuation of pass phase reduced, in the first state and the second state are achieved.

Figure 7A:
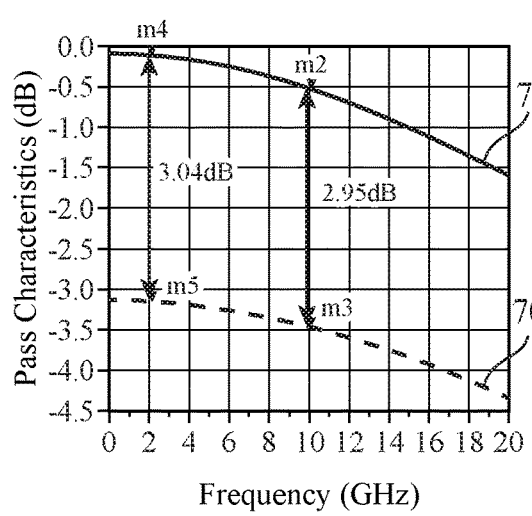
FIG. 7A is an explanatory graph illustrating pass characteristics of the variable attenuator according to the third embodiment of the invention.
Figure 7B:
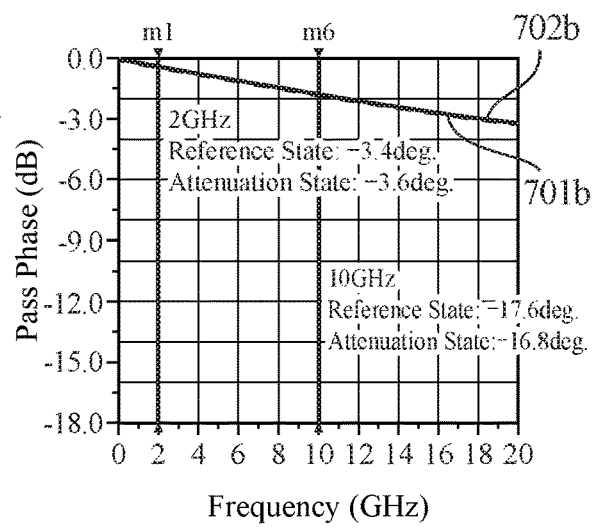
FIG. 7B is an explanatory graph illustrating pass phases thereof.

FIG. 7 illustrates results of calculation when the attenuation is set to 3 dB in the equivalent circuits illustrated in FIG. 6. FIG. 7A illustrates the pass characteristics, and FIG. 7B illustrates the pass phase. In FIG. 7A, a characteristic 701a represents the first state, a characteristic 702a represents the second state. In FIG. 7B, a characteristic 701b represents the first state, and a characteristic 702b represent the second state.

In the calculation, the element value of the resistor 13 is 18Ω, the element values of the resistor 16 and the resistor 19 are 274Ω, the off-capacitance of the third switch 14 is 0.05 pF, and the off-capacitances of the second switches 15 and 18 and the first switches 17 and 20 are 0.1 pF. The pass characteristics of the second state and the first state are 3.04 dB at 2 GHz and 2.95 dB at 10 GHz, and the difference between the pass characteristics is equal to or less than 0.1 dB. In a similar manner, the pass phase at 2 GHz is −3.4 deg in the second state and −3.6 deg in the first state, the pass phase at 10 GHz is −17.6 deg in the second state and −16.8 deg in the first state, and the phase difference between the first and second states is thus reduced to equal to or smaller than 1 deg. The configuration of the third embodiment enables reduction of phase fluctuation over a five times wider band.

As described above, according to the variable attenuator of the third embodiment, two shunt circuits of the π-attenuator are each replaced with the switching circuit of the first embodiment, a resistor is used for the circuit element of the switching circuit, the third switch is connected in parallel with the series resistor of the π-attenuator, the third switch is controlled to be off in the first state and to be on in the second state, the first switch is controlled to be off in the first state and to be on in the second state, and the second switch is controlled to be on in the first state and to be off in the second state, which enables reduction of phase change at switching over a wide band in the π-attenuator as well.

Fourth Embodiment

Figure 8:
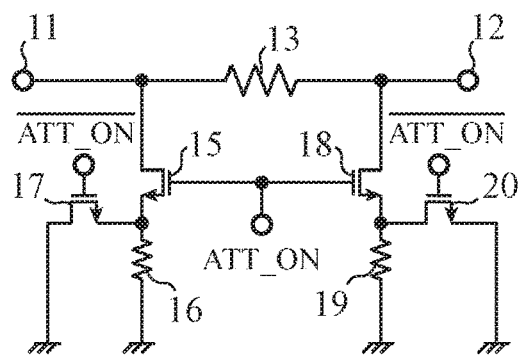
FIG. 8 is a configuration diagram illustrating a variable attenuator according to a fourth embodiment of the invention.

A fourth embodiment is an example of a π type variable attenuator with a low attenuation. FIG. 8 illustrates a variable attenuator of the fourth embodiment.

The variable attenuator illustrated in FIG. 8 includes a first terminal 11, a second terminal 12, a resistor 13, second switches 15 and 18, resistors 16 and 19, and first switches 17 and 20. In other words, the variable attenuator of the fourth embodiment has the same configuration as that of the π type variable attenuator presented in the third embodiment except that the third switch 14 is not connected in parallel with the resistor 13 connected in series between the first terminal 11 and the second terminal 12.

Next, operation of the variable attenuator of the fourth embodiment will be explained.

The π type variable attenuator of the fourth embodiment is capable of switching to a first state in which an input signal is attenuated by the resistor 13, the resistor 16, and the resistor 19, and a second state in which an input signal is not attenuated. In the first state, the second switches 15 and 18 are in the on state, and the first switches 17 and 20 are in the off state. In the second state, the second switches 15 and 18 are in the off state, and the first switches 17 and 20 are in the on state. When the attenuation in the first state is low, the resistance value of the resistor 13 is several ohms (Ω), and thus the resistor 13 need not be short-circuited as in the third embodiment. Equivalent circuits of the first state and the second state are equivalent to those in FIGS. 6A and 6B except that the parasitic capacitance 14a in the off state of the third switch 14 is not present, and the phase fluctuation in the first state and the second state can thus be reduced independently of the frequency according to the principle of the configuration of the circuit connected with the shunt presented in the first embodiment and the formula (3).

As described above, according to the variable attenuator of the fourth embodiment, two shunt circuits of the π-attenuator are each replaced with the switching circuit of the first embodiment, a resistor is used for the circuit element of the switching circuit, the first switch is controlled to be off in the first state and to be on in the second state, and the second switch is controlled to be on in the first state and to be off in the second state, which enables reduction of phase change at switching over a wide band in the π type variable attenuator with a low attenuation as well.

While the configuration of the first embodiment is used for the switching circuit in the third embodiment and the fourth embodiment described above, the configuration of the second embodiment may be used.

Fifth Embodiment

In a fifth embodiment, the switching circuit of the first embodiment is used for a T type variable attenuator.

Figure 9:
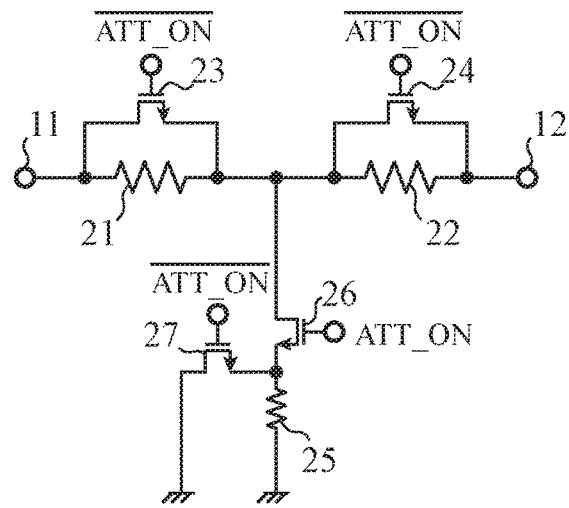
FIG. 9 is a configuration diagram illustrating a variable attenuator according to a fifth embodiment of the invention.

FIG. 9 is a configuration diagram illustrating a variable attenuator according to the fifth embodiment.

The variable attenuator illustrated in FIG. 9 includes a first terminal 11, a second terminal 12, resistors 21 and 22, a fourth switch 23, a fifth switch 24, a resistor 25, a second switch 26, and a first switch 27. The resistor 21 and the resistor 22 are connected in series between the first terminal 11 and the second terminal 12, the fourth switch 23 is connected in parallel with the resistor 21, and the fifth switch 24 is connected in parallel with the resistor 22. One end of the second switch 26 is connected with a connecting point of the resistor 21 and the resistor 22, and the resistor 25 and the first switch 27 are connected with the other end of the second switch 26. In addition, the other ends of the resistor 25 and the first switch 27 are grounded. The second switch 26 and the first switch 27 are switches corresponding to the second switch 5 and the first switch 4 of the first embodiment. Thus, in the variable attenuator of the fifth embodiment, a switching circuit constituted by the resistor 25, the second switch 26, and the first switch 27 is used for a shunt circuit of the T type variable attenuator.

FETs are used for the fourth switch 23, the fifth switch 24, the second switch 26, and the first switch 27, which are expressed by resistors in the on state and capacitive parasitic elements in the off state. The on-resistances in the on state are deemed to be negligible, the parasitic capacitances in the off state are represented by 23a, 24a, 26a, and 27a, and the capacitance values thereof are $C_{23}$, $C_{24}$, $C_{26}$, and $C_{27}$. In addition, the resistance values of the resistors 21, 22, and 25 are $R_{21}$, $R_{22}$, and $R_{25}$. Note that a switch using an FET uses between a drain terminal and a source terminal as a switch, and the drain terminal and the source terminal of the connection illustrated in FIG. 9 may be reversed.

Next, operation of the variable attenuator of the fifth embodiment will be explained.

The T type variable attenuator of the fifth embodiment is capable of switching to a first state in which an input signal is attenuated by the resistor 21, the resistor 22, and the resistor 25, and a second state in which the resistor 21 and the resistor 22 are short-circuited and the resistor 25 is disconnected from the first terminal 11 and the second terminal 12 so that an input signal is not attenuated. In the first state, the second switch 26 is in the on state, and the fourth switch 23, the fifth switch 24, and the first switch 27 are in the off state. In the second state, the second switch 26 is in the off state, and the fourth switch 23, the fifth switch 24, and the first switch 27 are in the on state. In addition, in the T type attenuator, because the resistor 21 and the resistor 22 typically have low resistances, the relations thereof with the off-capacitances of the switches are $R_{21} \ll 1/j\omega C_{23}$ and $R_{22} \ll 1/j\omega C_{24}$.

Figure 10A:
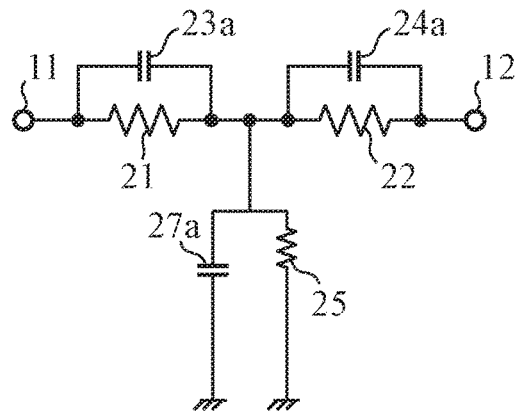
FIG. 10A is an equivalent circuit diagram illustrating operation in a first state of the variable attenuator.
Figure 10B:
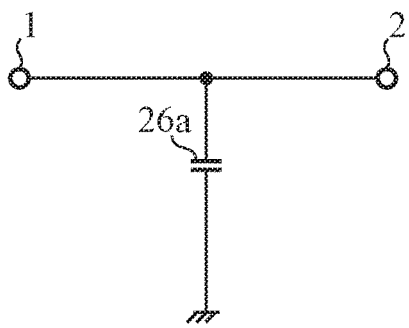
FIG. 10B is an equivalent circuit diagram illustrating operation in a second state of the variable attenuator according to the fifth embodiment of the invention.

An equivalent circuit of the first state is illustrated in FIG. 10A, and an equivalent circuit of the second state is illustrated in FIG. 10B. At higher frequencies or when the value of $R_{25}$ is larger than those in the formula (3) of the first embodiment, the phase fluctuation in the first state and the second state can be reduced independently of the frequency. In addition, the capacitance does not affect the absolute value of the attenuation of the T type variable attenuator. Thus, characteristics with different pass amplitudes, with the fluctuation of pass phase reduced, in the first state and the second state are achieved.

Figure 11A:
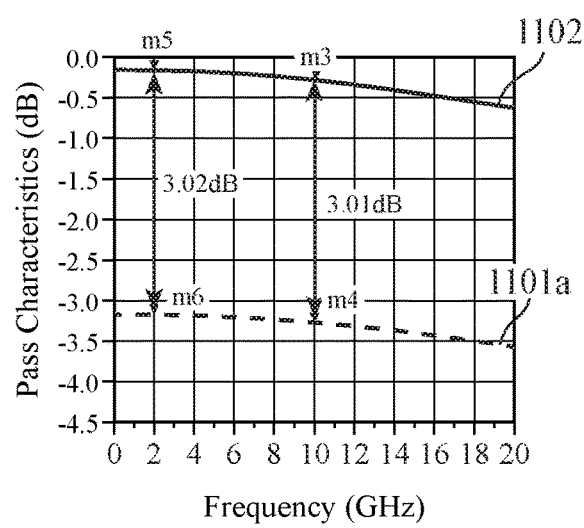
FIG. 11A is an explanatory graph illustrating pass characteristics of the variable attenuator according to the fifth embodiment of the invention.
Figure 11B:
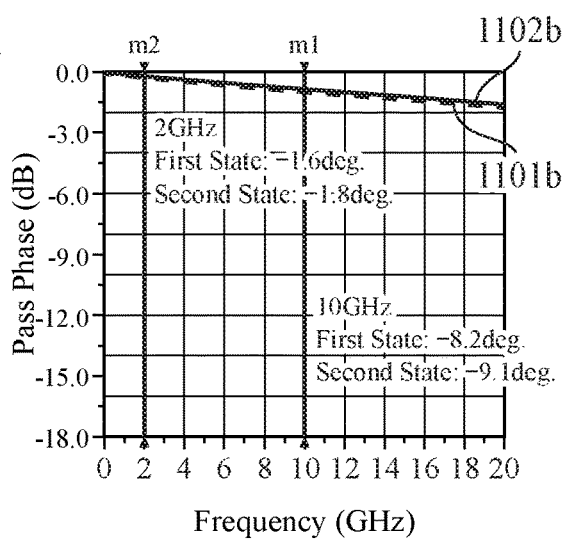
FIG. 11B is an explanatory graph illustrating pass phases thereof.

FIG. 11 illustrates results of calculation when the attenuation is set to 3 dB in the equivalent circuits illustrated in FIG. 9. FIG. 11A illustrates the pass characteristics, and FIG. 11B illustrates the pass phase. In FIG. 11A, a characteristic 1101a represents the first state, and a characteristic 1102a represents the second state. In FIG. 11B, a characteristic 1101b represents the first state, and a characteristic 1102b represents the second state.

In the calculation, the element values of the resistor 21 and the resistor 22 are 9Ω, the element value of the resistor 25 is 132Ω, the off-capacitances of the fourth switch 23 and the fifth switch 24 are 0.05 pF, and the off-capacitances of the second switch 26 and the first switch 27 are 0.1 pF. The pass characteristics in the second state and the first state are 3.02 dB at 2 GHz and 3.01 dB at 10 GHz, and the difference between the pass characteristics is equal to or less than 0.1 dB. In a similar manner, the pass phase at 2 GHz is −1.8 deg in the second state and −1.6 deg in the first state, the pass phase at 10 GHz is −9.1 deg in the second state and −8.2 deg in the first state, and the phase difference between the first and second states is thus reduced to equal to or smaller than 1 deg. In this manner, the configuration of the fifth embodiment enables reduction of phase fluctuation over a five times wider band.

As described above, according to the variable attenuator of the fifth embodiment, the shunt circuit of the T type attenuator is replaced with the switching circuit of the first embodiment, a resistor is used for the circuit element of the switching circuit, the fourth switch and the fifth switch are connected to be parallel to two series resistors of the T type attenuator, the fourth switch and the fifth switch are controlled to be off in the first state and to be on in the second state, the first switch is controlled to be off in the first state and to be on in the second state, and the second switch is controlled to be on in the first state and to be off in the second state, which enables reduction of phase change at switching over a wide band in the T type attenuator as well.

Sixth Embodiment

Figure 12:
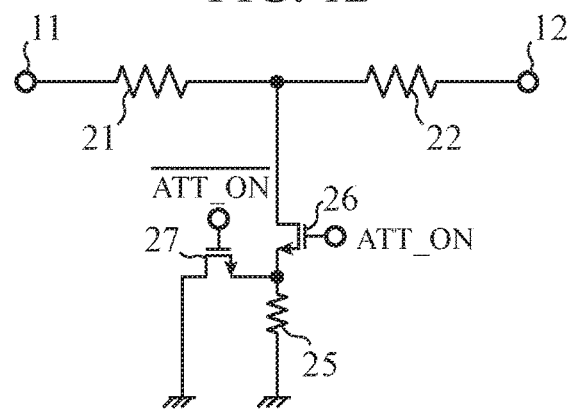
FIG. 12 is a configuration diagram illustrating a variable attenuator according to a sixth embodiment of the invention.

A sixth embodiment is an example of a T type variable attenuator with a low attenuation. FIG. 12 illustrates a variable attenuator of the sixth embodiment.

The variable attenuator illustrated in FIG. 12 includes a first terminal 11, a second terminal 12, resistors 21 and 22, a resistor 25, a second switch 26, and a first switch 27. In other words, the variable attenuator of the sixth embodiment has the same configuration as that of the T type variable attenuator presented in the fifth embodiment except that the fourth switch 23 and the fifth switch 24 connected in parallel with the resistors 21 and 22, respectively, connected in series between the first terminal 11 and the second terminal 12 are not included.

Next, operation of the variable attenuator of the sixth embodiment will be explained.

The T type variable attenuator of the sixth embodiment is capable of switching to a first state in which an input signal is attenuated by the resistor 21, the resistor 22, and the resistor 25, and a second state in which an input signal is not attenuated. In the first state, the second switch 26 is in the on state, and the first switch 27 is in the off state. In the second state, the second switch 26 is in the off state, and the first switch 27 is in the on state.

When the attenuation in the first state is low, the resistance values of the resistors 21 and 22 are low, and thus the resistors 21 and 22 need not be short-circuited as in the fifth embodiment. Equivalent circuits of the first state and the second state are equivalent to those in FIG. 10A and FIG. 10B except that the parasitic capacitance 23a in the off state of the fourth switch 23 and the parasitic capacitance 24a in the off state of the fifth switch 24 are not present. At higher frequencies or when the value of $R_{25}$ is larger than those in the formula (3) of the first embodiment, the phase fluctuation in the first state and the second state can be reduced independently of the frequency. In addition, the capacitance does not affect the absolute value of the attenuation of the T type variable attenuator. Thus, characteristics with different pass amplitudes, with the fluctuation of pass phase reduced, in the first state and the second state are achieved.

As described above, according to the variable attenuator of the sixth embodiment, the shunt circuit of the T type attenuator is replaced with the switching circuit of the first embodiment, a resistor is used for the circuit element of the switching circuit, the first switch is controlled to be off in the first state and to be on in the second state, and the second switch is controlled to be on in the first state and to be off in the second state, which enables reduction of phase change at switching over a wide band in the T type variable attenuator with a low attenuation as well.

While the configuration of the first embodiment is used for the switching circuit in the fifth embodiment and the sixth embodiment described above, the configuration of the second embodiment may be used.

The embodiments of the present invention can be freely combined, any components in the embodiments can be modified, and any components in the embodiments can be omitted within the scope of the invention.

INDUSTRIAL APPLICABILITY

As described above, a switching circuit and a variable attenuator according to the present invention relates to a configuration in which switches having the same parasitic component are connected in series and in parallel with a circuit element, and controlled to be alternately on and off, which is particularly effectively applied to a circuit that needs to reduce phase change at switching over a wide band in a variable attenuator.

REFERENCE SIGNS LIST

1, 11: first terminal, 2, 12: second terminal, 3: circuit element, 4, 6, 17, 20, 27: first switch, 5, 7, 15, 18, 26: second switch, 13, 16, 19, 21, 22, 25: resistor, 14: third switch, 23: fourth switch, 24: fifth switch

The invention claimed is:
1. A variable attenuator comprising:
  a switching circuit configured as a shunt circuit of the variable attenuator, the switching circuit including, a first switch connected in parallel with a first circuit element; and
a second switch connected in series with a parallel circuit constituted by the first circuit element and the first switch; and
a second circuit element connected in series with the first circuit element and the second switch,
wherein the first switch and the second switch alternately perform on-off operation,
the second switch has a parasitic reactance set in such a way that a parasitic reactance occurring at the parallel circuit in a first state in which the first switch is controlled to be off and the second switch is controlled to be on and a parasitic reactance occurring at the second switch in a second state in which the first switch is controlled to be on and the second switch is controlled to be off are equal to each other,
the first switch is controlled to be off in the first state and to be on in the second state, and
the second switch is controlled to be on in the first state and to be off in the second state.

2. The variable attenuator according to claim 1, wherein the variable attenuator is a π-attenuator having a third switch connected in parallel with the second circuit element, and first and second shunt circuits connected to respective ends of the second circuit element,
wherein the switching circuit is configured as the first shunt circuit,
a second switching circuit is configured as the second shunt circuit, the second switching circuit including
a fourth switch connected in parallel with a third circuit element; and
a fifth switch connected in series with a second parallel circuit constituted by the third circuit element and the fourth switch, and in series with the second circuit element,
a resistor is used for each of the first, second, and third circuit elements of the switching circuit.

3. The variable attenuator according to claim 1, wherein the variable attenuator is a π-attenuator having first and second shunt circuits connected to respective ends of the second circuit element,
wherein the switching circuit is configured as the first shunt circuit,
a second switching circuit is configured as the second shunt circuit, the second switching circuit including
a third switch connected in parallel with a third circuit element; and
a fourth switch connected in series with a parallel circuit constituted by the third circuit element and the third switch,
a resistor is used for each of the first and third circuit elements,
the first switch and the third switch are controlled to be off in the first state and to be on in the second state, and
the second switch and the fourth switch are controlled to be on in the first state and to be off in the second state.

4. The variable attenuator according to claim 1, wherein the variable attenuator is a T type attenuator with a third circuit element being connected in series with each of the second circuit element and the shunt circuit,
a resistor is used for each of the first, second, and third circuit elements,
a third switch connected in parallel with the second circuit element, and a fourth switch connected in parallel with the third circuit element,
the third switch and the fourth switch are controlled to be off in the first state and to be on in the second state,
the first switch is controlled to be off in the first state and to be on in the second state, and
the second switch is controlled to be on in the first state and to be off in the second state.

5. The variable attenuator according to claim 1, wherein the variable attenuator is a T type attenuator,
a resistor is used for the first circuit element of the switching circuit,
the first switch is controlled to be off in the first state and to be on in the second state, and
the second switch is controlled to be on in the first state and to be off in the second state.

6. The switching circuit according to claim 1, wherein the first switch and the second switch each operate as a short circuit while being on and as capacitance while being off.

7. The variable attenuator according to claim 6, wherein the variable attenuator is a π-attenuator having a third switch connected in parallel with the second circuit element, and first and second shunt circuits connected to respective ends of the second circuit element,
wherein the switching circuit is configured as the first shunt circuit,
a second switching circuit is configured as the second shunt circuit, the second switching circuit including
a fourth switch connected in parallel with a third circuit element; and
a fifth switch connected in series with a second parallel circuit constituted by the third circuit element and the fourth switch, and in series with the second circuit element,
a resistor is used for each of the first, second, and third circuit elements of the switching circuit.

8. The variable attenuator according to claim 6, wherein the variable attenuator is a π-attenuator having first and second shunt circuits connected to respective ends of the second circuit element,
wherein the switching circuit is configured as the first shunt circuit,
a second switching circuit is configured as the second shunt circuit, the second switching circuit including
a third switch connected in parallel with a third circuit element; and
a fourth switch connected in series with a parallel circuit constituted by the third circuit element and the third switch,
a resistor is used for each of the first and third circuit elements,
the first switch and the third switch are controlled to be off in the first state and to be on in the second state, and
the second switch and the fourth switch are controlled to be on in the first state and to be off in the second state.

9. The variable attenuator according to claim 6, wherein the variable attenuator is a T type attenuator with a third circuit element being connected in series with each of the second circuit element and the shunt circuit,
a resistor is used for each of the first, second, and third circuit elements,
a third switch connected in parallel with the second circuit element, and a fourth switch connected in parallel with the third circuit element,
the third switch and the fourth switch are controlled to be off in the first state and to be on in the second state,
the first switch is controlled to be off in the first state and to be on in the second state, and the second switch is controlled to be on in the first state and to be off in the second state.

10. The variable attenuator according to claim 6, wherein the variable attenuator is a T type attenuator,
a resistor is used for the first circuit element of the switching circuit,
the first switch is controlled to be off in the first state and to be on in the second state, and
the second switch is controlled to be on in the first state and to be off in the second state.

11. The switching circuit according to claim 1, wherein the first switch and the second switch each operate as a short circuit while being on and as an inductor while being off.

12. The variable attenuator according to claim 11, wherein the variable attenuator is a π-attenuator having a third switch connected in parallel with the second circuit element, and first and second shunt circuits connected to respective ends of the second circuit element,
wherein the switching circuit is configured as the first shunt circuit,
a second switching circuit is configured as the second shunt circuit, the second switching circuit including
a fourth switch connected in parallel with a third circuit element; and
a fifth switch connected in series with a second parallel circuit constituted by the third circuit element and the fourth switch, and in series with the second circuit element,
a resistor is used for each of the first, second, and third circuit elements of the switching circuit.

13. The variable attenuator according to claim 11, wherein the variable attenuator is a π-attenuator having first and second shunt circuits connected to respective ends of the second circuit element,
wherein the switching circuit is configured as the first shunt circuit,
a second switching circuit is configured as the second shunt circuit, the second switching circuit including
a third switch connected in parallel with a third circuit element; and
a fourth switch connected in series with a parallel circuit constituted by the third circuit element and the third switch,
a resistor is used for each of the first and third circuit elements,
the first switch and the third switch are controlled to be off in the first state and to be on in the second state, and
the second switch and the fourth switch are controlled to be on in the first state and to be off in the second state.

14. The variable attenuator according to claim 3, wherein the variable attenuator is a T type attenuator with a third circuit element being connected in series with each of the second circuit element and the shunt circuit,
a resistor is used for each of the first, second, and third circuit elements,
a third switch connected in parallel with the second circuit element, and a fourth switch connected in parallel with the third circuit element,
the third switch and the fourth switch are controlled to be off in the first state and to be on in the second state,
the first switch is controlled to be off in the first state and to be on in the second state, and
the second switch is controlled to be on in the first state and to be off in the second state.

15. The variable attenuator according to claim 11, wherein the variable attenuator is a T type attenuator,
a resistor is used for the first circuit element of the switching circuit,
the first switch is controlled to be off in the first state and to be on in the second state, and
the second switch is controlled to be on in the first state and to be off in the second state.

* * * * *